United States Patent
Kanaya et al.

[11] Patent Number: 6,025,217
[45] Date of Patent: *Feb. 15, 2000

[54] METHOD OF FORMING POLYCRYSTALLINE SEMICONDUCTOR THIN FILM

[75] Inventors: Yasuhiro Kanaya; Masaru Yamazaki; Masahiro Fujino; Nobuaki Suzuki; Midori Kuki, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/561,246

[22] Filed: Nov. 21, 1995

[30] Foreign Application Priority Data

Nov. 24, 1994 [JP] Japan .............................. P06-314152

[51] Int. Cl.[7] .................................................. H01L 21/786
[52] U.S. Cl. ............................................. 438/166; 438/308
[58] Field of Search ........................... 437/21, 40 TFT, 437/41 TFT, 173, 174, 233, 907, 908, 967; 117/8–10, 43, 904; 148/DIG. 90–DIG. 93; 438/166, 308, 987

[56] References Cited

U.S. PATENT DOCUMENTS

| | | | |
|---|---|---|---|
| 4,693,759 | 9/1987 | Noguchi et al. | 437/24 |
| 5,145,808 | 9/1992 | Sameshima et al. | 437/173 |
| 5,365,875 | 11/1994 | Asai et al. | 117/10 |
| 5,424,230 | 6/1995 | Wakai | 437/40 |
| 5,529,951 | 6/1996 | Noguchi et al. | 437/174 |
| 5,561,075 | 10/1996 | Nakazawa | 437/174 |
| 5,612,251 | 3/1997 | Lee | 117/8 |

FOREIGN PATENT DOCUMENTS 2-283073  11/1990  Japan .

OTHER PUBLICATIONS

T.W. Little et al., IDRC '91 Proc., p. 219, "A 9.5 inch . . . TFT–LCD fabricated by SPC of very thin films and ECR–CVD gate insulator" Oct. 1991.

T. Noguchi et al., Jpn. J. Appl. Phys. 25(2)(1986)L121 "Low temperature polysilicon super thin film transistor (LSFT)" Feb. 1986.

G.B. Anderson et al., MRS Symp. Proc. 343(1994)709 "Characterization of . . . ELC polycrystalline silicon . . . ", 1994.

I. Asai et al., Extended Abstracts of Int'l Conf. on Solid State Devices and Materials (1992) 55 "A fabrication of homogeneous poly–si TFT using ELA", 1992.

A. Kohno et al., IEEE Trans. Electron Dev. 42(2)(1995)251 "High performance poly–si TFTs . . . pulsed laser annealing . . . ", Feb. 1995.

K.K. Ng et al., IEEE Electron Dev. Lett. 2(12)(1981)317 "Effects of grain boundaries on laser crystallined poly–si MOSFET's", Dec. 1981.

Y.M. Jhon et al., Jpn. J. Appl. Phys., 33(10B)(1994)L1438 "Crystallinzation of a–Si by ELA . . . Gaussian profile", Oct. 1994.

*Primary Examiner*—Charles Bowers
*Assistant Examiner*—Martin Sulsky
*Attorney, Agent, or Firm*—Hill & Simpson

[57] ABSTRACT

Method of forming a uniform polycrystalline semiconductor thin film by laser annealing. The method is started with preparing a substrate having an insulating layer which has a relatively low thermal conductivity and a thickness of more than 20 nm. Then, an amorphous silicon thin film having a relatively high thermal conductivity is formed to a thickness of less than 35 nm on the insulating layer. Thereafter, the amorphous silicon thin film is irradiated with laser beam to impart thermal energy to the film. In this way, the amorphous film is converted into a polysilicon thin film. Since the thickness of the amorphous silicon film is less than 35 nm, polysilicons having uniform grain diameters can be grown.

11 Claims, 8 Drawing Sheets

METHOD OF FORMING POLYCRYSTALLINE SEMICONDUCTOR THIN FILM

FIELD OF THE INVENTION

The present invention relates to a method of forming a polycrystalline semiconductor thin film and, more particularly, to techniques for changing an amorphous semiconductor thin film into a polycrystalline semiconductor thin film by laser irradiation. The invention also relates to a method of fabricating a thin-film semiconductor device in which integrated TFTs (thin-film transistors) are formed, using a polycrystalline semiconductor thin film as their device regions. Furthermore, the invention relates to a method of fabricating an active matrix liquid crystal display incorporating TFTs as a active matrix array substrate.

BACKGROUND OF THE INVENTION

The prior art TFT semiconductor device has used a heatproof insulating substrate made of quartz or the like. TFTs have been fabricated at a high density by performing a high-temperature process above 1000° C. Such TFT semiconductor devices have been earnestly developed, for example, as active matrix array substrates for active matrix liquid crystal displays. To find wider application of liquid crystal displays, there is a demand for a reduction in cost of fabricating TFT semiconductor devices. Low-temperature processes capable of adopting cheaper glass substrates have been discussed. Especially, in order to fabricate a large-sized, high-information content liquid crystal display, low-temperature processes capable of utilizing cheaper glass substrates have been earnestly developed. In this connection, a technique consisting of forming a film of amorphous silicon on a glass substrate of a relatively low melting point and irradiating the film with a laser beam to convert the film into high-quality polysilicon has been studied. Since polysilicon has larger carrier mobility than that of amorphous silicon, high-performance TFTs can be formed at a high density.

Amorphous silicon is once melted by laser irradiation and then becomes polycrystalline. In the prior art techniques, when amorphous silicon is changed into a polycrystalline state by laser annealing in this way, the original amorphous silicon thin film is formed to a thickness of 40 to 50 nm or to a thickness of about 100 nm. If laser annealing is performed with such thicknesses, the crystals are epitaxially grown in the direction of thickness of the thin film. Therefore, the crystal grain sizes are increased by amounts corresponding to the thickness of the film. However, where an amorphous silicon thin film has a thickness of 40 to 50 nm or more, individual crystal grains tend to be grown in the direction of the thickness, i.e., in the vertical direction. Furthermore, the grain sizes of silicon crystals formed by laser annealing depend heavily on the intensity, or energy, of the irradiating laser radiation. For these reasons, if the uniformity of the cross-sectional energy distribution of the laser beam is poor, then it follows that the crystal grain sizes of silicon are not uniform. Moreover, the silicon crystal grain size at the interface between non-irradiated and irradiated regions differs from the crystal grain size in the center of the irradiated region. Once silicon crystals of small grain sizes are formed by laser annealing with a relatively small energy, if the crystals are subsequently irradiated with laser beam having a relatively large energy, then it is very difficult to increase the crystal grain sizes up to the level achieved by the method consisting of first irradiating crystals with laser beam of relatively large energy so as to grow the crystals to large sizes. Consequently, crystal grains once grown are not greatly grown even if laser annealing is again performed and so it is difficult to modify the grain sizes. Where amorphous silicon is changed into polycrystalline silicon, the amorphous silicon is sometimes scanned with laser beam of a given cross-sectional area such that one irradiated region overlaps with the adjacent irradiated region. In this way, an amorphous silicon thin film of a large area can be changed into a polycrystalline silicon thin film. In this case, if the thickness of the amorphous silicon thin film is in excess of 40 nm, it has been difficult to perform laser annealing in such a way that crystal grain sizes are increased uniformly. For example, the continuity of the crystal grain size is disturbed at the interface between the adjacent irradiated regions overlapping with each other.

SUMMARY OF THE INVENTION

In view of the foregoing problems with the prior art techniques, it is an object of the present invention to provide a method of forming a polycrystalline semiconductor thin film consisting of crystal grains having uniform diameters. This method is started with a preparation step consisting of preparing a substrate having an insulating layer which has a relatively low thermal conductivity and a thickness of more than 20 nm. Then, a film formation step is carried out. This step consists of forming an amorphous semiconductor thin film which has a relatively high thermal conductivity and a thickness of less than 35 nm on the insulating layer. Finally, an annealing step is performed. This step consists of irradiating the amorphous semiconductor thin film with laser beam so as to apply thermal energy to the film, thus converting the film into a polycrystalline semiconductor thin film.

The novel method of forming such a polycrystalline semiconductor thin film can be applied to a method of fabricating thin-film semiconductor devices. In this method, a film formation step is carried out. That is, an amorphous semiconductor thin film having a high thermal conductivity and a thickness of less than 35 nm is formed on an insulating layer which has a low thermal conductivity and a thickness of more than 20 nm. Then, an annealing step is effected. In particular, the amorphous semiconductor thin film is irradiated with laser beam so as to impart thermal energy to the film, thus converting it into a polycrystalline semiconductor thin film. Finally, a fabrication step is carried out to form an integrated TFTs, using the polycrystalline semiconductor thin film as their device regions.

The aforementioned method of fabrication of the TFTs can be especially preferably applied to manufacture of an active matrix liquid crystal display. This manufacturing method is started with a film formation step. This step comprises forming an amorphous semiconductor thin film having a high thermal conductivity and a thickness of less than 35 nm on a first substrate having an insulating layer which has a low thermal conductivity and a thickness of more than 20 nm. Then, an annealing step is carried out. That is, the amorphous semiconductor thin film is irradiated with laser beam to apply thermal energy to the film. Thus, the film is converted into a polycrystalline semiconductor thin film. Subsequently, a first fabrication step is effected. This step comprises forming TFTs at a high density, using the polycrystalline semiconductor thin film as their device regions. Then, a second fabrication step is performed. That is, pixel electrodes are formed and connected to the individual TFTs. Finally, an assembly step is performed. This step comprises preparing a second substrate having a counter electrode previously formed thereon, bonding the second substrate to the first substrate via a given space, and injecting a liquid crystal material into the space.

The laser annealing is conducted under the condition that the thickness of the amorphous semiconductor thin film is less than 35 nm. This limits epitaxial growth in the direction of thickness of the film, i.e., in the vertical direction. As a result, a polycrystalline semiconductor thin film having uniform grain diameters can be formed. At this time, the insulating layer having a relatively low thermal conductivity and a thickness of more than 20 nm is located under the amorphous semiconductor thin film having a relatively high thermal conductivity. Consequently, the amorphous semiconductor thin film can be thermally isolated. The result is that the thermal energy supplied by the laser irradiation can be efficiently utilized. Crystals undergone the laser annealing are epitaxially grown vertically preferentially. Then, growth of crystals is extended also laterally. In the present invention, the thickness of the amorphous semiconductor thin film is limited below 35 nm and so vertical crystal growth is limited. On the other hand, the crystals are grown laterally to some extent. As a result, uniform grain diameters can be accomplished. If TFTs are formed, using the polycrystalline semiconductor thin film obtained in this way as their device regions (i.e., active layer), then excellent electrical characteristics are obtained. For example, sufficiently low OFF current and sufficiently high ON current are derived. This is described in Japanese Patent Publication No. 69094/1994. Specifically, it says that TFTs having an active layer comprised of a polycrystalline semiconductor thin film having a thickness of 10 to 40 nm exhibit excellent electrical characteristics.

Other objects and features of the invention will appear in the course of the description thereof, which follows.

DETAILED DESCRIPTION OF THE INVENTION

Figure 1A:
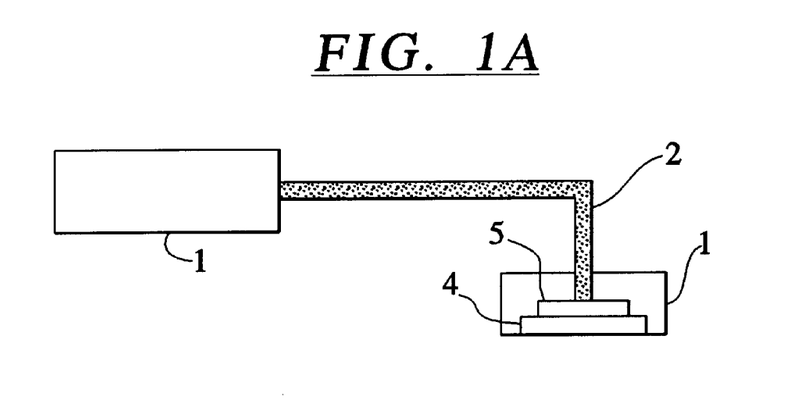
FIGS. 1(A)–1(D) are schematic views illustrating a method of forming a polycrystalline semiconductor thin film in accordance with the present invention.

The preferred examples of the present invention are hereinafter described in detail with reference to the accompanying drawings. FIGS. 1(A)–1(D) are schematic views illustrating a method of forming a polycrystalline semiconductor thin film in accordance with the present invention. FIG. 1(A) illustrates an apparatus used for the novel method. This machine is equipped with a laser 1 producing laser beam 2 in the form of a beam. For example, an XeCl excimer laser can be used as the laser 1. The apparatus further includes a chamber 3 into which the laser beam 2 is introduced. An XY stage 4 is accommodated within the chamber 3. A substrate 5 to be irradiated with the laser beam is placed on the XY stage 4. An amorphous semiconductor thin film (e.g., an amorphous silicon thin film) is formed on the substrate 5 to a thickness of less than 35 nm. The laser beam 2 is made to impinge on the amorphous semiconductor thin film from above it. The thermal energy of the laser beam is absorbed by the amorphous silicon thin film, whereby this thin film is heated. As a result, the film becomes polycrystalline. Even if the amorphous silicon thin film has a large area, it can be made polycrystalline uniformly by moving the XY stage 4 carrying the substrate 5 thereon while irradiating the film with the laser beam 2. In the present example, an XeCl excimer laser is employed as the laser 1. Any desired laser can be used as long as the laser beam can be well absorbed by the amorphous silicon so that it is heated up to its melting point.

Figure 1B:
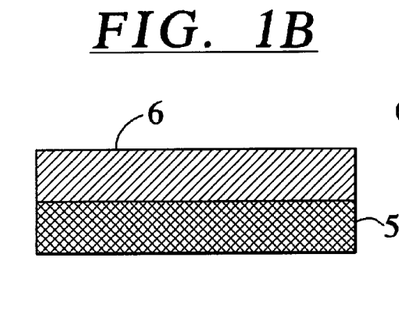

FIG. 1(B) is a schematic cross section showing an example of the structure of the substrate 5. In the present example, an amorphous silicon thin film 6 is formed directly on the substrate 5 comprised of a transparent dielectric material such as glass. For instance, the amorphous silicon thin film 6 is formed to a thickness of less than 35 nm at a film formation temperature of 300° C. by plasma-assisted CVD (PCVD). It is to be noted that this is only an example of the method. The film formation temperature can be appropriately selected within the range of 200–600° C., taking account of the heatproofness of the glass. Furthermore, the amorphous silicon thin film 6 may be formed by LPCVD instead of PCVD. The substrate 5 is made of glass. The material of the substrate is not limited to glass. Quartz having excellent heat resistance may also be used. The glass substrate 5 has a lower thermal conductivity than that of the amorphous silicon thin film 6. The substrate 5 itself forms an insulating layer having a thickness of more than 20 nm.

Figure 1C:
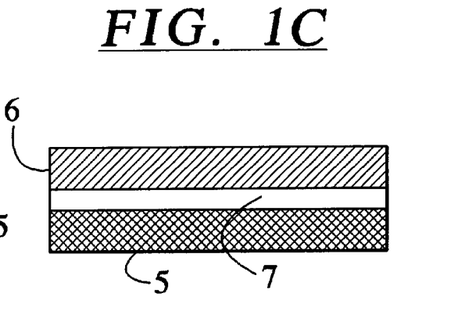

FIG. 1(C) shows another example of the structure of the substrate. In the present example, the substrate 5 comprised of silicon. The surface is coated with an insulating film 7. This insulating film 7 is made of silicon oxide or the like having a relatively low thermal conductivity. The film thickness is set to 20 nm or more. Accordingly, this insulating film 7 forms an insulating layer having a low thermal conductivity and a thickness of more than 20 nm. The amorphous silicon thin film 6 is formed on this insulating film 7 to a thickness of less than 35 nm. In either the structure shown in FIG. 1(B) or the structure shown in FIG. 1(C), the insulating layer of a low thermal conductivity is located under the amorphous silicon thin film 6. The substrate itself is made from a material which is affected neither chemically nor physically at the laser annealing temperature. The thermal energy imparted by the laser beam is prevented from being dissipated, because the insulating layer of a low thermal conductivity is positioned under the amorphous silicon thin film 6. Furthermore, the amorphous silicon thin film 6 is thermally isolated from the substrate 5 by the insulating layer.

Figure 1D:
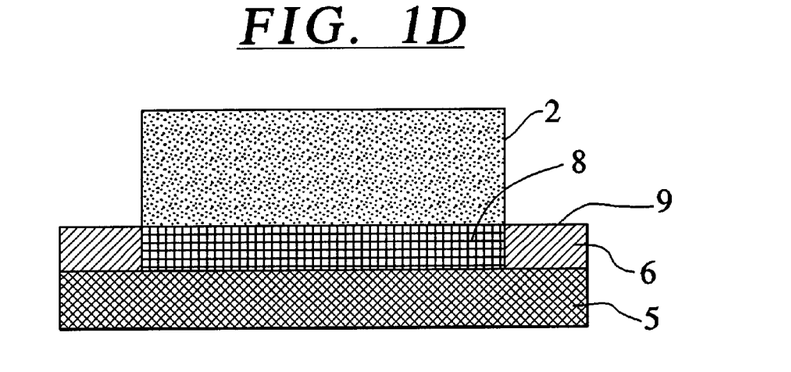

An annealing step is carried out as illustrated in FIG. 1(D). Laser beam 2 is directed to the amorphous silicon thin film 6 to impart thermal energy to it. In this way, the amorphous film 6 is converted into a polycrystalline semiconductor thin film. The amorphous silicon contained in the irradiated region, indicated by 8, is once melted and then crystallizes. The amorphous silicon existing in the non-irradiated region, indicated by 9, is left as it is.

Figure 2:
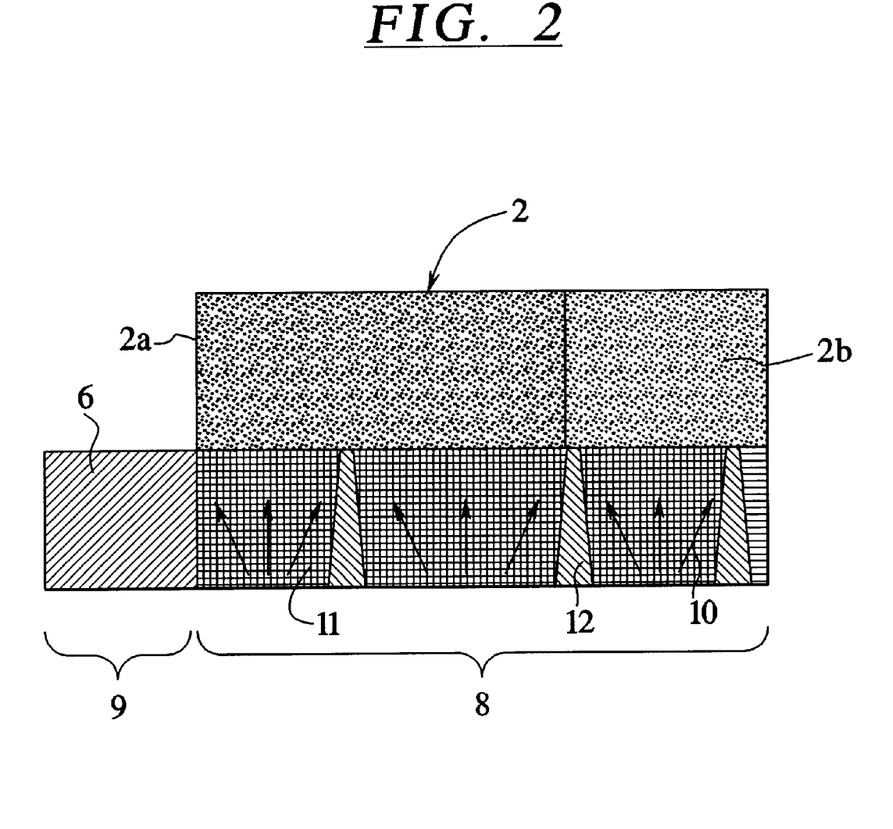
FIG. 2 is a schematic view illustrating one example of physics of crystallization according to the present invention.

The physics of crystallization is next described in detail by referring to FIG. 2. The amorphous silicon thin film 6 formed on the substrate (not shown in FIG. 2) is irradiated with the laser beam 2. In the present example, for simplicity, it is assumed that the laser beam 2 has a nonuniform intensity distribution containing a higher energy portion 2a and a lower energy portion 2b. The laser beam 2 is absorbed by the amorphous silicon thin film 6 and heated to its melting point. Subsequently, the amorphous silicon is induced to crystallize in a cooling process. Where the thickness of the amorphous silicon thin film 6 is less than 35 nm as in the present invention, vertical crystal growth is limited physically. However, even in the lower energy portion 2b, vertical crystal growth progresses quickly. Moreover, crystallization progresses laterally as indicated by the arrows 10, because this thin film absorbs more thermal energy from the laser beam than the film having a thickness of more than 35 nm. Therefore, if the energy distribution of the laser beam 2 is somewhat nonuniform, the resulting silicon crystal grains 11 have uniform diameters of about tens of nanometers. Also, where the silicon crystal grains 11 are comparatively small, sufficient energy is supplied to the thin film 6. Consequently, quite few electrical defects occur at the grain boundaries 12 between crystals. Where this silicon is used in TFT devices and similar applications, very good electrical characteristics are obtained. That is, sufficiently large ON current and sufficiently small OFF current are derived. In this way, where the thickness of the amorphous silicon thin film 6 is set to less than 35 nm, a polycrystalline silicon thin film having high uniformity and good electrical characteristics can be obtained by laser annealing.

Figure 3:
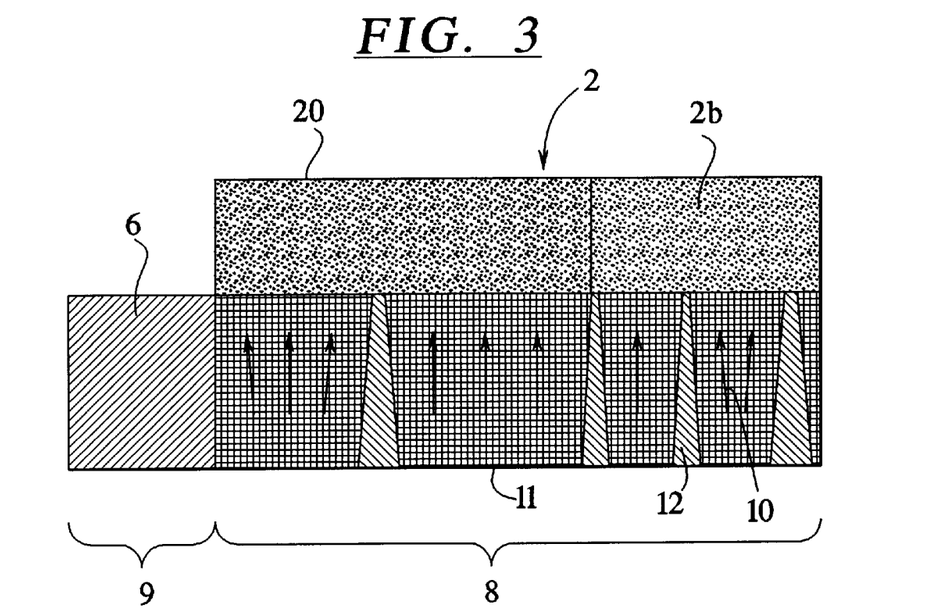
FIG. 3 is a schematic view illustrating one comparative example of the physics of crystallization.

For reference, the physics of crystallization occurring where the amorphous silicon thin film 6 is more than 35 nm in thickness is illustrated in FIG. 3. For ease of understanding, like components are indicated by like reference numerals in both FIGS. 2 and 3. Where the thickness of the amorphous silicon thin film 6 increases beyond 35 nm, the individual crystal grains 11 are freely grown vertically as indicated by the arrows 10. Any physical limitation due to the thickness is not imparted to the growth. Therefore, the diameters of the crystal grains 11 formed by laser annealing depend materially on the energy distribution. Where the cross-sectional energy distribution of the laser beam 2 is not uniform as shown, the individual crystal grains 11 differ from each other in size. For example, in the higher energy portion 2a, the crystal grains 11 tend to become relatively large. In the lower energy portion 2b, the crystal grains 11 tend to remain relatively small. That is, where the amorphous silicon thin film 6 is relatively thick, vertical crystal growth progresses relatively freely without being physically limited; no lateral crystal growth is induced. As a result, the crystal grains become nonuniform, depending on the energy intensities.

Figure 4:
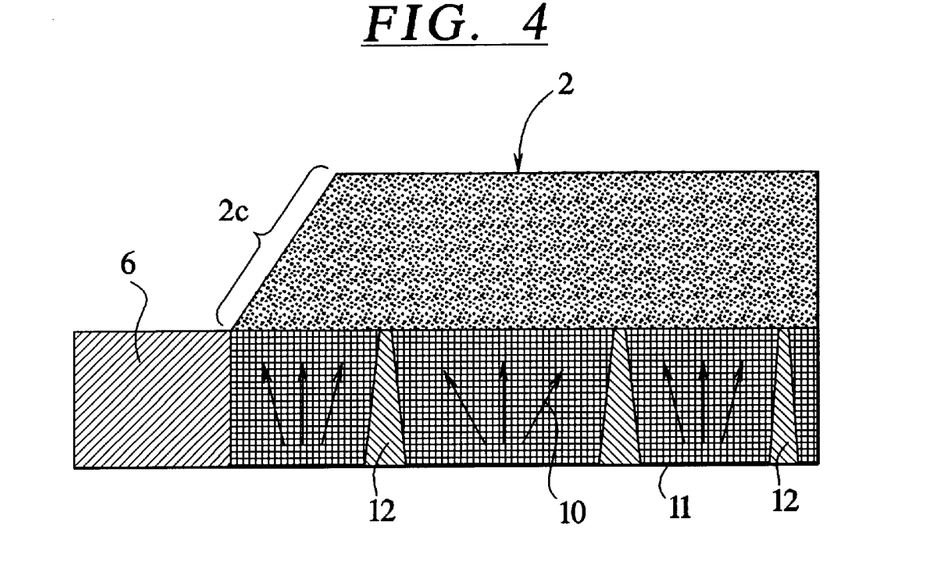
FIG. 4 is a schematic view illustrating another example of physics of crystallization according to the invention.

FIG. 4 schematically represents the physics of crystallization where an energy gradient is produced at the peripheral portion 2c of the cross section of the laser beam 2. Where the thickness of the amorphous silicon thin film 6 is set to less than 35 nm as in the present invention, greater tolerance is given to the crystal growth compared with the nonuniformity of the energy distribution. In consequence, the crystal grains 11 are grown relatively greatly even at the peripheral portion 2c.

Figure 5:
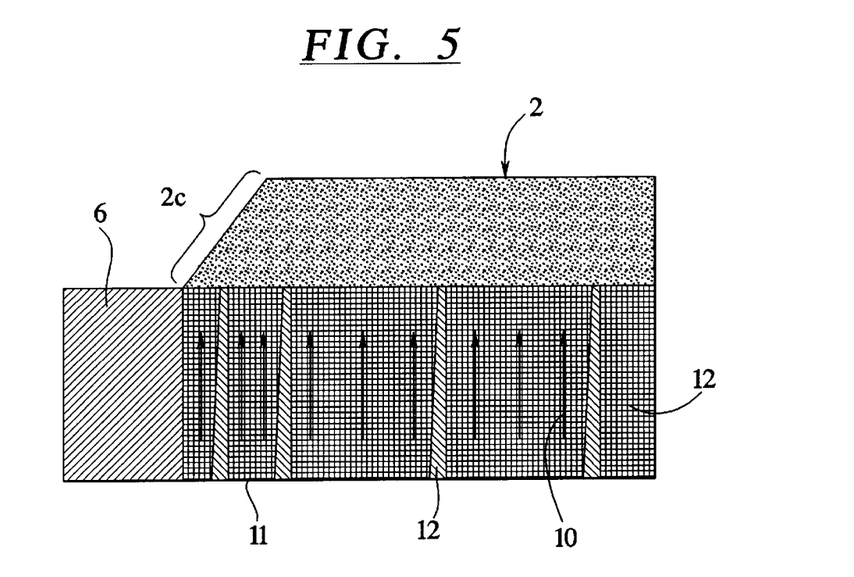
FIG. 5 is a schematic view illustrating another comparative example of the physics of crystallization.

On the other hand, FIG. 5 schematically represents the physics of crystallization where the thickness of the amorphous silicon thin film 6 is in excess of 35 nm. In the peripheral portion 2c where the cross-sectional energy intensities of the laser beam 2 are small, the crystal grains 11 are much smaller than those in the central portion of the cross section.

Figure 6:
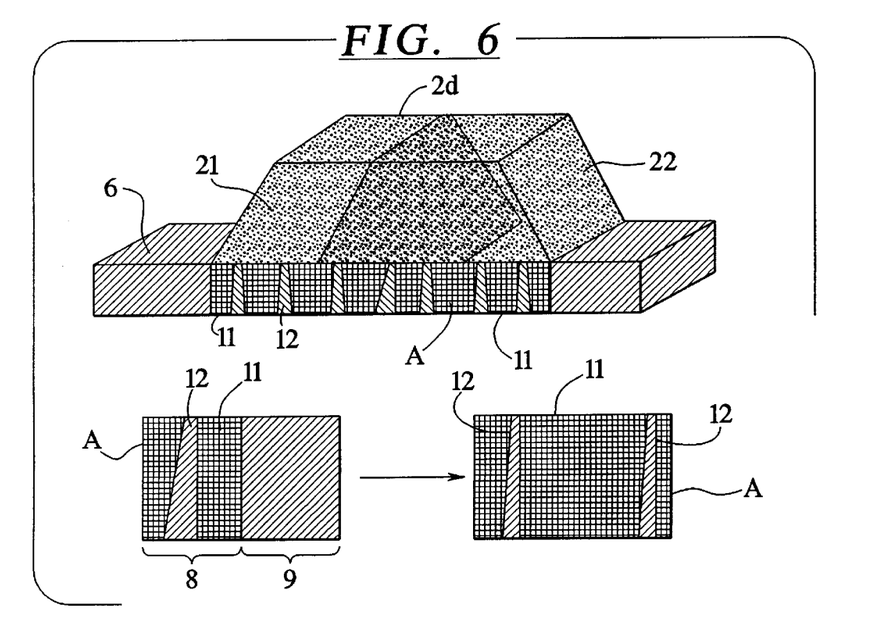
FIG. 6 is a schematic view illustrating a further example of the physics of crystallization according to the invention.

FIG. 6 schematically represents the physics of crystallization where the film is scanned with the laser beam. That is, the laser beam spot is moved from one region to the adjacent region and so on. As mentioned previously, the cross-sectional intensity distribution of the laser beam has a gradient at the peripheral portions. First laser beam 21 created by the first shot of the laser beam overlaps with second laser beam 22 created by the second shot of the laser beam. The overlapped portion is indicated by 2d. The difference between the sizes of the crystal grains 11 in the overlapped portion 2d and the sizes of the crystal grains 11 in the non-overlapped portions is reduced by setting the thickness of the amorphous silicon thin film 6 to less than 35 nm. A region A along the boundary of the first laser beam 21 is partially exaggerated. The degree of crystallization occurring at the marginal region 8 of the first laser beam 21 is somewhat smaller than the degree of crystallization occurring in the center. However, the crystal grains become equal to the sizes of the crystal grains in the other portions, because the energy of the second laser beam 22 induces lateral crystal growth.

Figure 7:
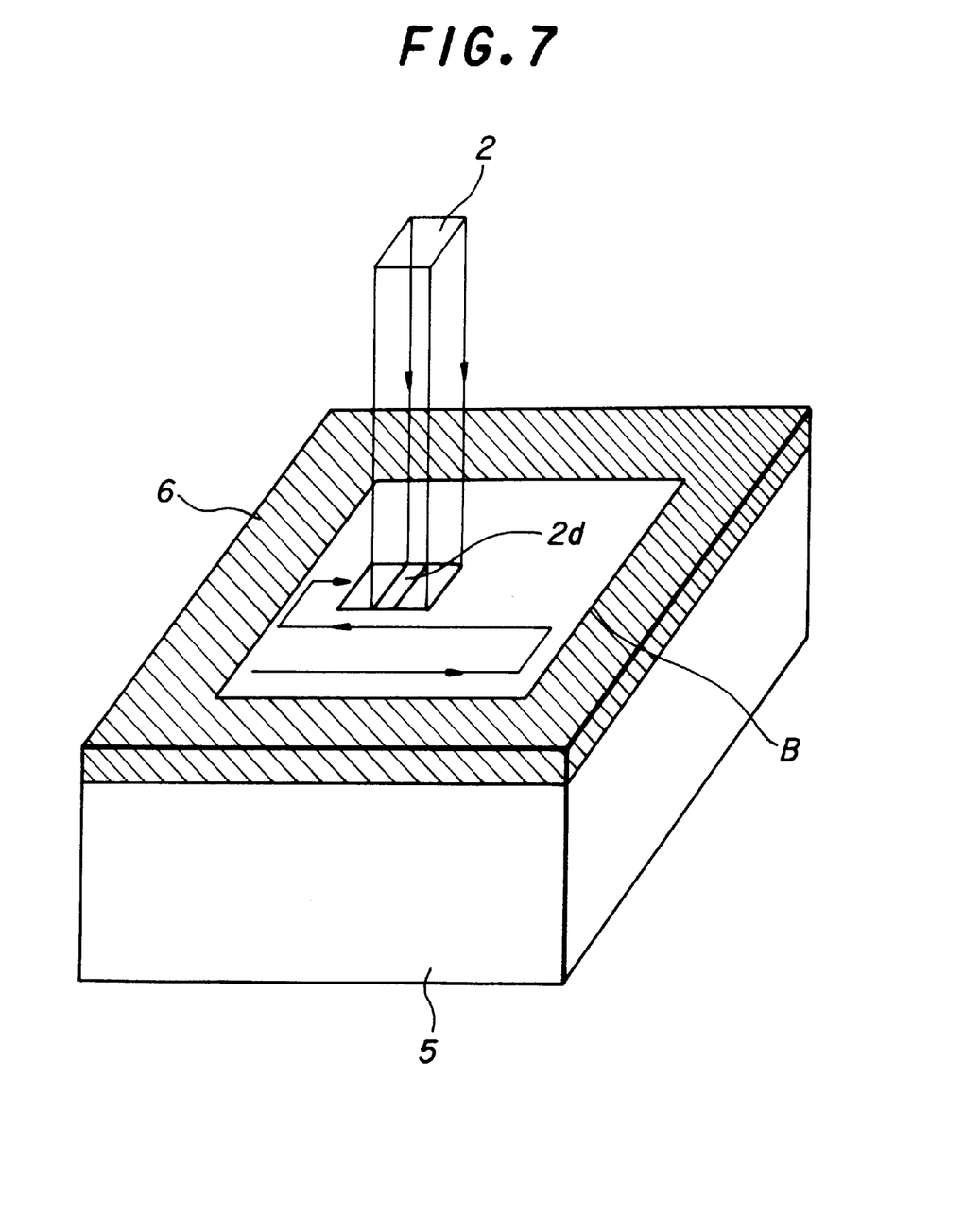
FIG. 7 is a perspective view illustrating one example of a laser irradiation method according to the invention.

FIG. 7 schematically shows the manner in which the amorphous silicon thin film 6 formed on the transparent insulating substrate 5 is rendered polycrystalline while scanning the laser beam 2. As described above, the sizes of the crystal grains in the overlapped portion 2d are comparable to the sizes of the grains in the other portions. By scanning the laser beam in this way, the amorphous silicon in a large-area region B can be made uniformly polycrystalline. Specifically, even if the adjacent laser beams created by the scan of the laser beam overlap with each other, the continuity of the crystal grains at the interface is maintained. Hence, a silicon polycrystalline thin film having uniform grain diameters over a large area can be formed.

The method of fabricating TFT devices (acting as a active matrix array substrate) for a display device is next described by referring to FIGS. 8(A)–8(G). First, at the step illustrated in FIG. 8(A), a transparent insulating substrate 61 is prepared. The substrate 61 is made of a glass material, for example, having a maximum processing temperature of about 600° C. A semiconductor thin film 62 acting as the active layer of TFTs is formed on this substrate 61. For example, amorphous silicon is formed to a thickness of less than 35 nm by plasma-assisted CVD (PCVD). Then, at the step illustrated in FIG. 8(B), the semiconductor thin film 62 is patterned into desired form so that the film acts as device regions of the TFTs. An impurity is introduced into the device regions by ion implantation or other method, thus forming source regions S and drain regions D. At the next step illustrated in FIG. 8(C), an antireflective film 63 is formed to enhance the irradiation efficiency of laser beam. This antireflective film consists of $SiO_2$, for example, and has a thickness of 30 to 100 nm. Subsequently, at the step illustrated in FIG. 8(D), the laser beam is directed to the semiconductor thin film 62 via the antireflective film 63. The energy is approximately 150 to 500 $mJ/cm^2$. The irradiation time is set to more than 10 nsec. This laser irradiation makes the channel regions Ch in the semiconductor thin film 62 poly-crystalline and, at the same time, activates the impurity introduced in the source regions S and the drain regions D.

Figure 8A:
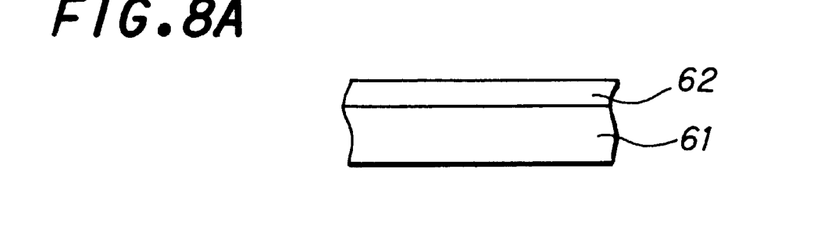
FIGS. 8(A)–8(G) are cross-sectional views illustrating successive steps of one example of method for fabricating TFT devices according to the invention.
Figure 8B:
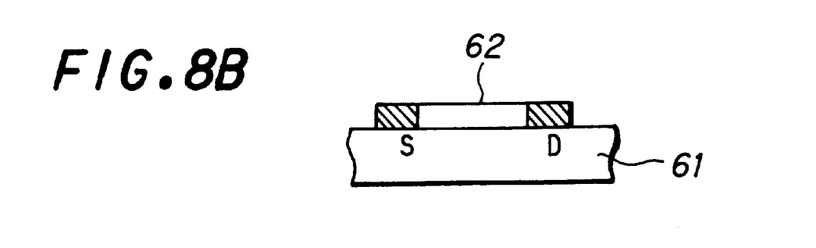
Figure 8C:
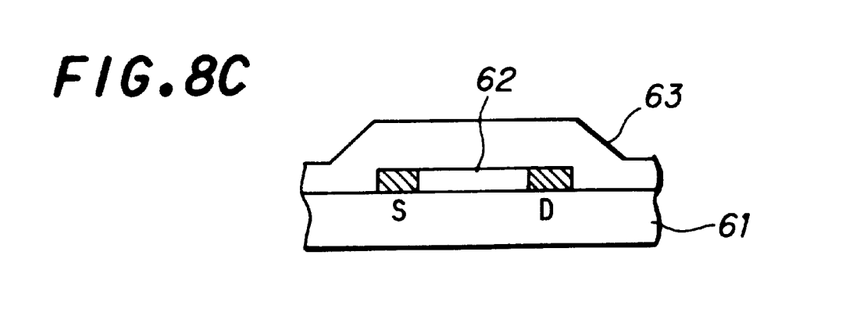
Figure 8D:
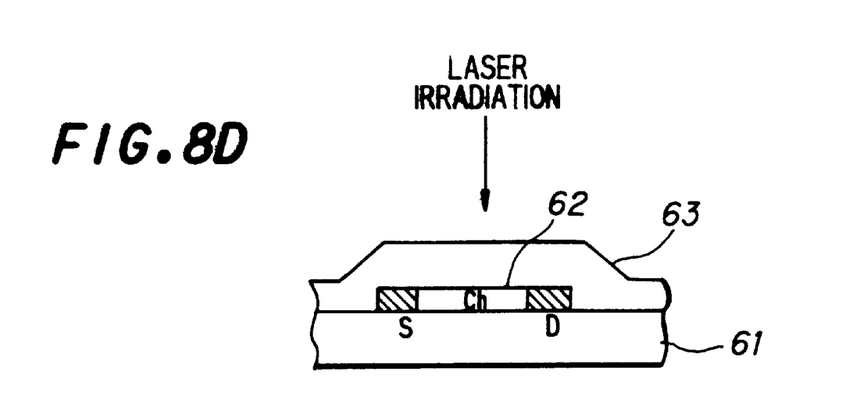

One-shot irradiation of the laser beam permits crystallization of the amorphous silicon and activation of the impurity below the maximum processing temperature of the transparent insulating substrate 61.

Figure 8E:
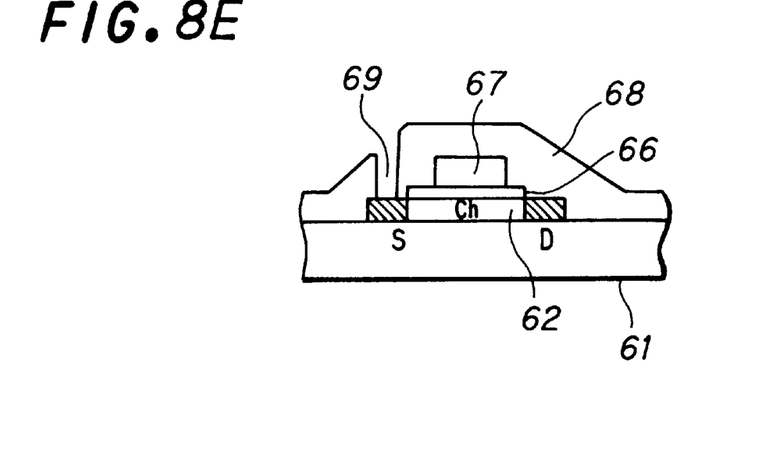
Figure 8F:
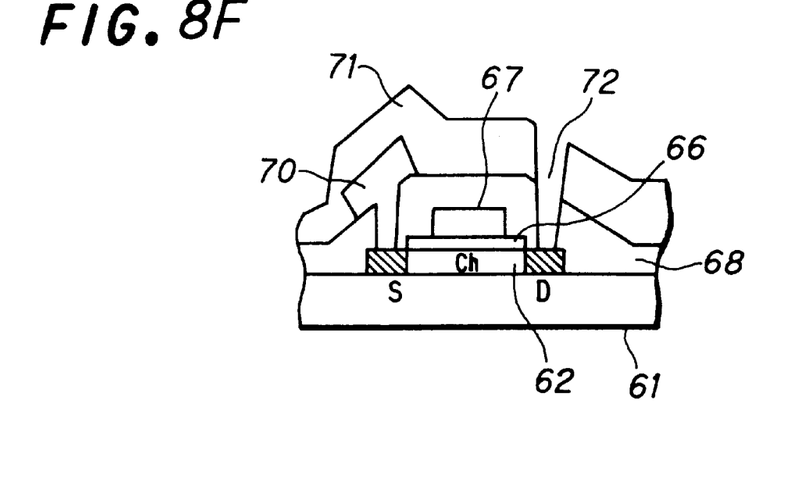
Figure 8G:
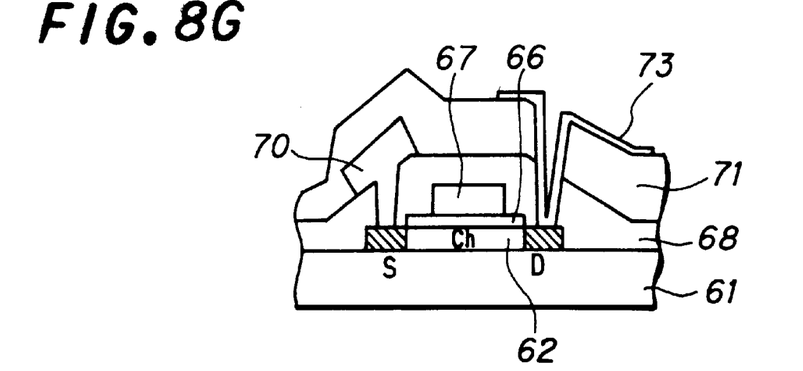

The processing then goes to the step illustrated in FIG. 8(E), where the antireflective film 63 which is made unnecessary after the laser irradiation is peeled off. Then, a gate-insulating film 66 is formed on the channel regions Ch. This gate-insulating film 66 is made from $SiO_2$, P—SiN, or other material. For instance, the insulating film 66 has a thickness of 150 nm. Gate electrodes 67 are formed on the gate-insulating film 66. In this example, the material of the gate electrodes 67 is aluminum. This enables processing below 600° C. Then, a first interlayer dielectric film 68 consisting of PSG is formed to a thickness of 500 nm. This dielectric film 68 is etched to form contact holes 69 in communication with the source regions S. Thereafter, at the step illustrated in FIG. 8(F), a patterned metallization layer 70 connected with the source regions S is formed. PSG is deposited on the metallization layer 70 to a thickness of 500 nm to form a second interlayer dielectric film 71. Contact holes 72 in communication with the drain regions D via the second interlayer dielectric film 71 and via the first interlayer dielectric film 68 are formed. Finally, at the step illustrated in FIG. 8(G), ITO is deposited as a film on the second interlayer dielectric film 71 and patterned into desired forms, thus forming pixel electrodes 73. In this way, TFT devices for a display device are completed.

Figure 9:
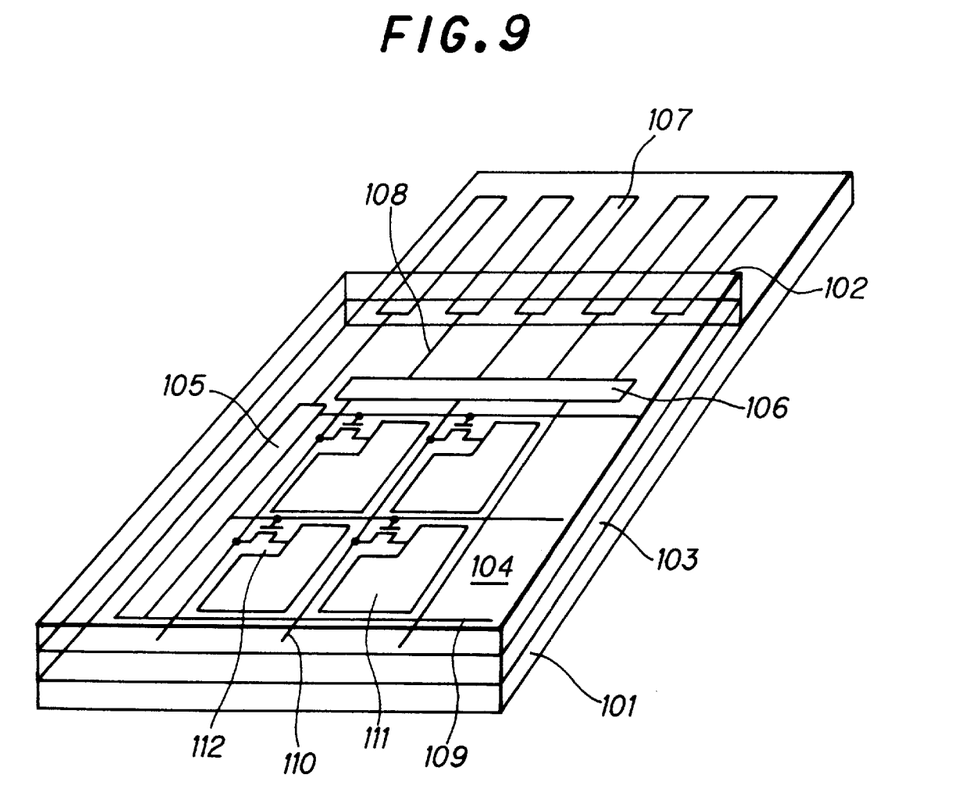
FIG. 9 is a perspective view of an active matrix liquid crystal display using TFT devices fabricated according to the invention as a active matrix array substrate.

FIG. 9 shows an example of an active matrix liquid crystal display assembled, using the above-described TFT devices for a display device as a active matrix array substrate. This liquid crystal display includes a liquid crystal material 103 held between the active matrix array substrate, indicated by 101, and a counter substrate 102. Thus, a panel structure is formed. A number of pixels 104 are arrayed on the active matrix array substrate 101. Also, a driver circuit is formed on the active matrix array substrate 101 and divided into a vertical scanning circuit 105 and a horizontal scanning circuit 106. Terminals 107 for external connections are formed at the top end of a peripheral portion of the active matrix array substrate 101. The terminals 107 are connected with the vertical scanning circuit 105 and with the horizontal scanning circuit 106 via conductive interconnects 108. The arrayed pixels 104 include gate lines 109 and signal lines 110 which are perpendicular to each other. Pixel electrodes 111 and TFTs 112 for driving the pixel electrodes 111 are formed at the intersections of the lines 109 and 110. The source electrodes of the TFTs 112 are connected with their respective signal lines 110. The gate electrodes are connected with their respective gate lines 109. The drain electrodes are connected with their respective pixel electrodes 111. The gate lines 109 are connected with the vertical scanning circuit 105. The signal lines 110 are connected with the horizontal scanning circuit 106.

As described thus far, in the present invention, laser annealing is performed under the condition that the thickness of the amorphous semiconductor thin film is less than 35 nm. This limits vertical crystal growth. As a result, polycrystals having uniform grain diameters can be easily obtained. Setting the thickness of the amorphous semiconductor thin film to less than 35 nm widens the distribution of the optimum energy of the light energy used in the laser annealing. For this reason, in the laser annealing, the degree of variation in crystal grain diameter decreased compared with the nonuniformity of the light energy within the cross section of the light. Where the amorphous semiconductor thin film is scanned with the laser beam such that any adjacent irradiated regions overlap with each other in laser annealing, uniform crystallization can be accomplished. Furthermore, the energy necessary for the crystallization is smaller than the energy necessary where the thickness of the amorphous semiconductor thin film is more than 35 nm. Consequently, more efficient laser annealing is carried out.

What is claimed is:

1. A method of forming thin-film semiconductor devices, comprising the steps of:

preparing an insulating substrate;

preparing an insulating layer on said substrate having a relatively low thermal conductivity and a thickness of more than 20 nm;

forming an amorphous semiconductor thin film having a high thermal conductivity to a thickness of less than 35 nm on said insulating layer;

patterning the amorphous semiconductor thin film into device regions of the thin-film semiconductor devices;

introducing an impurity into the device regions by ion implantation to form source and drain regions for each device region;

forming an anti-reflective film over the device regions;

performing a laser annealing after the step of forming said anti-reflective film by non-uniformly irradiating said amorphous semiconductor thin film with a laser beam to simultaneously convert said amorphous semiconductor thin film into polycrystalline semiconductor thin film channel regions having uniform crystal grain diameters and activate the impurity introduced into the source and drain regions below a maximum processing temperature of the insulating substrate;

removing the anti-reflective film;

forming a gate-insulating film on each of the channel regions only; and forming gate electrodes on each of the gate-insulating films.

2. A method of forming thin-film semiconductor devices as set forth in claim 1, wherein said laser annealing is carried out by one-shot of laser beam.

3. A method of forming thin-film semiconductor devices as set forth in claim 1, wherein said laser annealing is carried out by scanning said laser beam.

4. A method of forming thin-film semiconductor devices as set forth in claim 1, wherein said amorphous semiconductor thin film comprised of amorphous silicon.

5. A method of forming thin-film semiconductor devices as set forth in claim 1, wherein said non-uniform irradiation is a result of a non-uniform cross-sectional energy distribution of the laser beam.

6. A method of forming thin-film semiconductor devices as set forth in claim 1, wherein said non-uniform irradiation is a result of portions of said amorphous semiconductor thin film being overlappingly irradiated.

7. A method of fabricating a liquid crystal display, comprising the steps of:

preparing a first insulating substrate having an insulating layer which has a low thermal conductivity and a thickness of more than 20 nm;

forming an amorphous semiconductor thin film having a high thermal conductivity to a thickness of less than 35 nm on said first substrate;

patterning the amorphous semiconductor thin film into device regions of the thin-film semiconductor devices;

introducing an impurity into the device regions by ion implantation to form source and drain regions for each device region;

forming an anti-reflective film over the device regions;

irradiating said amorphous semiconductor thin film with a laser beam in a non-uniform manner after the step of forming said anti-reflective film to simultaneously convert said amorphous semiconductor thin film into polycrystalline semiconductor thin film channel regions having uniform crystal grain diameters and activate the impurity introduced into the source and drain regions below a maximum processing temperature of the insulating substrate;

removing the anti-reflective film;

forming a gate-insulating film on each of the channel regions only;

forming gate electrodes on each of the gate-insulating films;

forming pixel electrodes in communication with said drain regions;

preparing a second insulating substrate having a counter electrode thereon;

bonding said second substrate to said first substrate via a given space; and injecting a liquid crystal material into said space.

8. A method of forming a liquid crystal display as set forth in claim 7, wherein said amorphous semiconductor thin film comprised of amorphous silicon.

9. A method of forming a liquid crystal display as set forth in claim 7, wherein said step of irradiating said amorphous semiconductor thin film with the laser beam is carried out by one-shot of laser beam.

10. A method of forming a liquid crystal display as set forth in claim 7, wherein said non-uniform irradiation is a result of a non-uniform cross-sectional energy distribution of the laser beam.

11. A method of forming a liquid crystal display as set forth in claim 7, wherein said non-uniform irradiation is a result of portions of said amorphous semiconductor thin film being overlappingly irradiated.

* * * * *